(12) United States Patent
Kulathumani et al.

(10) Patent No.: US 10,088,893 B2
(45) Date of Patent: *Oct. 2, 2018

(54) SELECTIVE WAKEUP OF DIGITAL SENSING AND PROCESSING SYSTEMS USING RECONFIGURABLE ANALOG CIRCUITS

(71) Applicant: West Virginia University, Morgantown, WV (US)

(72) Inventors: Vinod Kulathumani, Morgantown, WV (US); David W. Graham, Morgantown, WV (US); Brandon David Rumberg, Morgantown, WV (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/593,896

(22) Filed: May 12, 2017

(65) Prior Publication Data
US 2017/0255252 A1 Sep. 7, 2017

Related U.S. Application Data

(63) Continuation of application No. 14/627,011, filed on Feb. 20, 2015, now Pat. No. 9,679,093.

(60) Provisional application No. 61/942,355, filed on Feb. 20, 2014, provisional application No. 62/079,645, filed on Nov. 14, 2014.

(51) Int. Cl.
| | |
|---|---|
| *G06F 1/32* | (2006.01) |
| *H04W 4/70* | (2018.01) |
| *G06F 17/50* | (2006.01) |
| *G06F 15/78* | (2006.01) |

(52) U.S. Cl.
CPC .............. *G06F 1/3296* (2013.01); *G06F 1/32* (2013.01); *G06F 1/3203* (2013.01); *G06F 1/3206* (2013.01); *G06F 1/3231* (2013.01); *G06F 15/7867* (2013.01); *G06F 17/5054* (2013.01); *H04W 4/70* (2018.02); *Y02D 10/12* (2018.01); *Y02D 10/13* (2018.01)

(58) Field of Classification Search
CPC ......... G06F 1/32; G06F 1/3203; G06F 1/3206
See application file for complete search history.

(56) References Cited

U.S. PATENT DOCUMENTS

| | | | | |
|---|---|---|---|---|
| 4,239,936 | A * | 12/1980 | Sakoe | G10L 15/20 704/233 |
| 7,248,059 | B1 * | 7/2007 | Ochoco | H04Q 9/00 324/609 |
| 7,675,431 | B1 * | 3/2010 | Caouette, Sr. | G08G 1/0965 340/902 |
| 2004/0236873 | A1 * | 11/2004 | Kasame | G06F 15/7867 710/1 |
| 2006/0239336 | A1 * | 10/2006 | Baraniuk | H04L 25/20 375/216 |
| 2007/0256428 | A1 * | 11/2007 | Unger | F04B 35/045 62/6 |

(Continued)

*Primary Examiner* — Andrew Bee
(74) *Attorney, Agent, or Firm* — Buckley, Maschoff & Talwalkar LLC

(57) ABSTRACT

According to some embodiments, a sensor network may be provided with re-programmable and/or reconfigurable analog circuitry configured to monitor data collected by the sensor network. The re-programmable and/or reconfigurable analog circuitry may also generate a wakeup signal in response to a defined wakeup event detected by the sensor network.

20 Claims, 15 Drawing Sheets

(56) References Cited

U.S. PATENT DOCUMENTS

2013/0298100 A1* 11/2013 Hastings ................. G06F 17/50
  716/126
2013/0321373 A1* 12/2013 Yoshizumi ............... G09G 5/00
  345/211

* cited by examiner

SELECTIVE WAKEUP OF DIGITAL SENSING AND PROCESSING SYSTEMS USING RECONFIGURABLE ANALOG CIRCUITS

CROSS-REFERENCE TO RELATED APPLICATIONS

The present application is a continuation of U.S. patent application Ser. No. 14/627,011 entitled "SELECTIVE WAKEUP OF DIGITAL SENSING AND PROCESSING SYSTEMS USING RECONFIGURABLE ANALOG CIRCUITS" filed on Feb. 2, 2015 which claimed the benefit of: (i) U.S. Provisional Patent Application No. 61/942,355, entitled "SELECTIVE WAKEUP OF DIGITAL SENSING AND PROCESSING SYSTEMS USING RECONFIGURABLE ANALOG CIRCUITS" and filed on Feb. 20, 2014; and (ii) U.S. Provisional Patent Application No. 62/079,645, entitled "SELECTIVE WAKEUP OF DIGITAL SENSING AND PROCESSING SYSTEMS USING RECONFIGURABLE ANALOG CIRCUITS" and filed on Nov. 14, 2014. The entire contents of those applications are incorporated herein by reference.

STATEMENT REGARDING FEDERALLY SPONSORED RESEARCH OR DEVELOPMENT

This invention was made with government support under agreement number CNS-1148815 awarded by the National Science Foundation. The Government has certain rights in the invention.

FIELD

Some embodiments are associated with sensor networks. More specifically, some embodiments utilize Field-Programmable Analog Arrays ("FPAA") for energy-efficient sensor networks.

BACKGROUND

Sensor networks can be utilized for a variety of tasks including, e.g., monitoring critical infrastructures such as bridges and/or monitoring vital signs in biomedical applications. In many cases, implementation of sensor networks is limited by the power available to drive the sensor networks.

Accordingly, methods and mechanisms for accurately and efficiently providing a sensor network may be desired.

DETAILED DESCRIPTION

Disclosed herein are various examples related to reconfigurable analog signal processing. Note that continuous sampling of sensor data into the digital domain and processing of this data to detect and identify events of interest may involve computationally intensive operations and can quickly drain the energy resources of a device. Analog circuits may be used to perform preliminary signal processing, keeping the digital portion of the system in a state of hibernation until events of interest have been detected by the analog circuit, which can then wake up the digital sampling and processing. The analog signal processing may selectively wakeup the more power hungry digital portions of the processing system, based on events of interest that can be specified at run-time. Interfacing reconfigurable analog circuits with digital devices such as smart phones and smart sensors may significantly extend the lifetime of the digital devices. Wakeup events may be, according to some embodiments, specified for the reconfigurable analog circuits at runtime by using the digital interface to synthesize analog arrays. The analog circuit may be synthesized through a digital interface to configure events of interest, and thus not limit the use case to a specific sensing or monitoring application. The digital circuits may be put into hibernation by operating them in the available power save modes of the device. Full power mode may be restored by means of an interrupt when the analog signal processing has detected a specific event.

According to some embodiments, ultra-low power analog signal processors may be leveraged to analyze data in the native analog domain as opposed to sampling the data and processing it in the digital domain. Note that processing data in the digital domain contributes to higher power consumption. Some embodiments described herein may allow the power hungry digital portion of a sensing system to stay in extended periods of hibernation, while still not missing any event of interest. This may increase the operational lifetime of such systems and also increase the potential application space for such systems.

Figure 1:
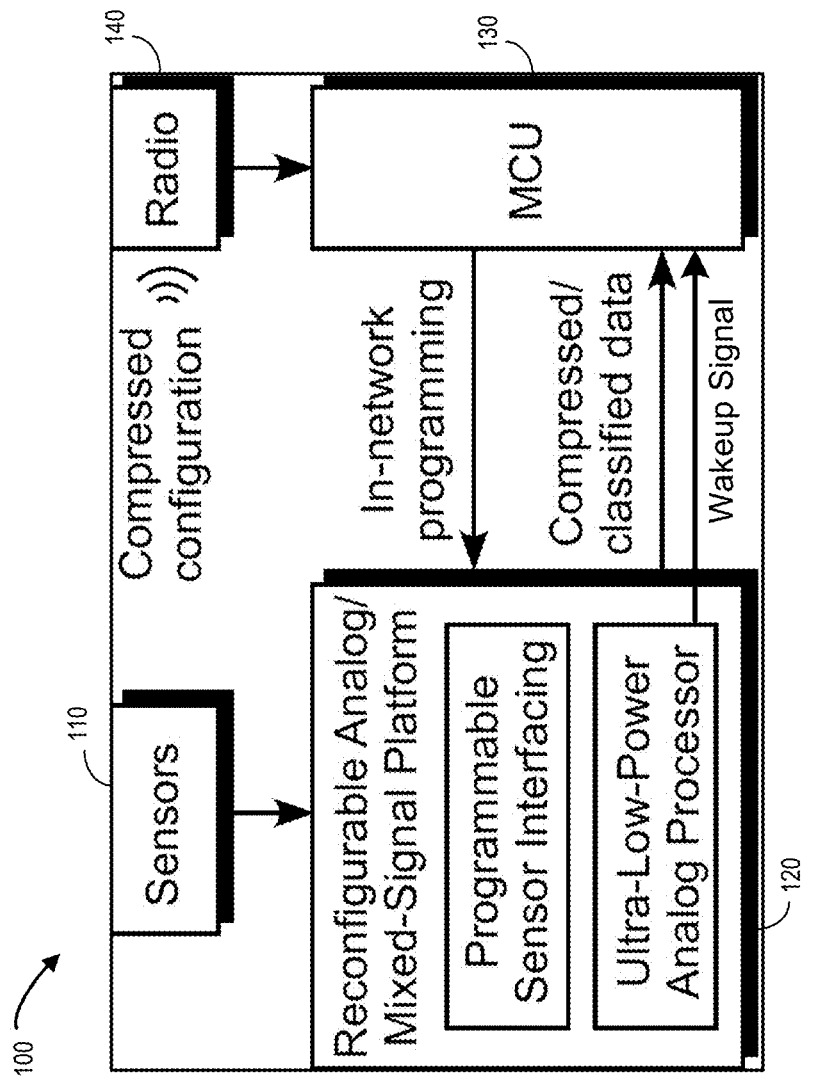
FIG. 1 is a high level block diagram illustrating an architecture of a wireless sensor with a reprogrammable analog processor in accordance with some embodiments.

For example, FIG. 1 is a high level block diagram illustrating an apparatus 100 associated with a wireless sensor having a reprogrammable analog processor in accordance with some embodiments. The apparatus 100 includes sensors 110 that provide signals to a reconfigurable analog/mixed signal platform 120. The reconfigurable analog/mixed signal platform 120 may include, for example, programmable sensor interfacing and/or an ultra-low power analog processor. The reconfigurable analog/mixed signal platform 120 may provide compressed and/or classified data and may also provide wakeup signals to a Micro Control Unit ("MCU") 130. The MCU 130 may also provide in-network programming to the reconfigurable analog/mixed signal platform 120 (e.g., based on compressed configuration signals received via a wireless radio 140). Such an apparatus 100 may help developers implement early, and often compute-intensive, stages of a signal-processing chain with "custom" low-power hardware, while also having an option to reprogram the hardware after deployment.

Figure 2:
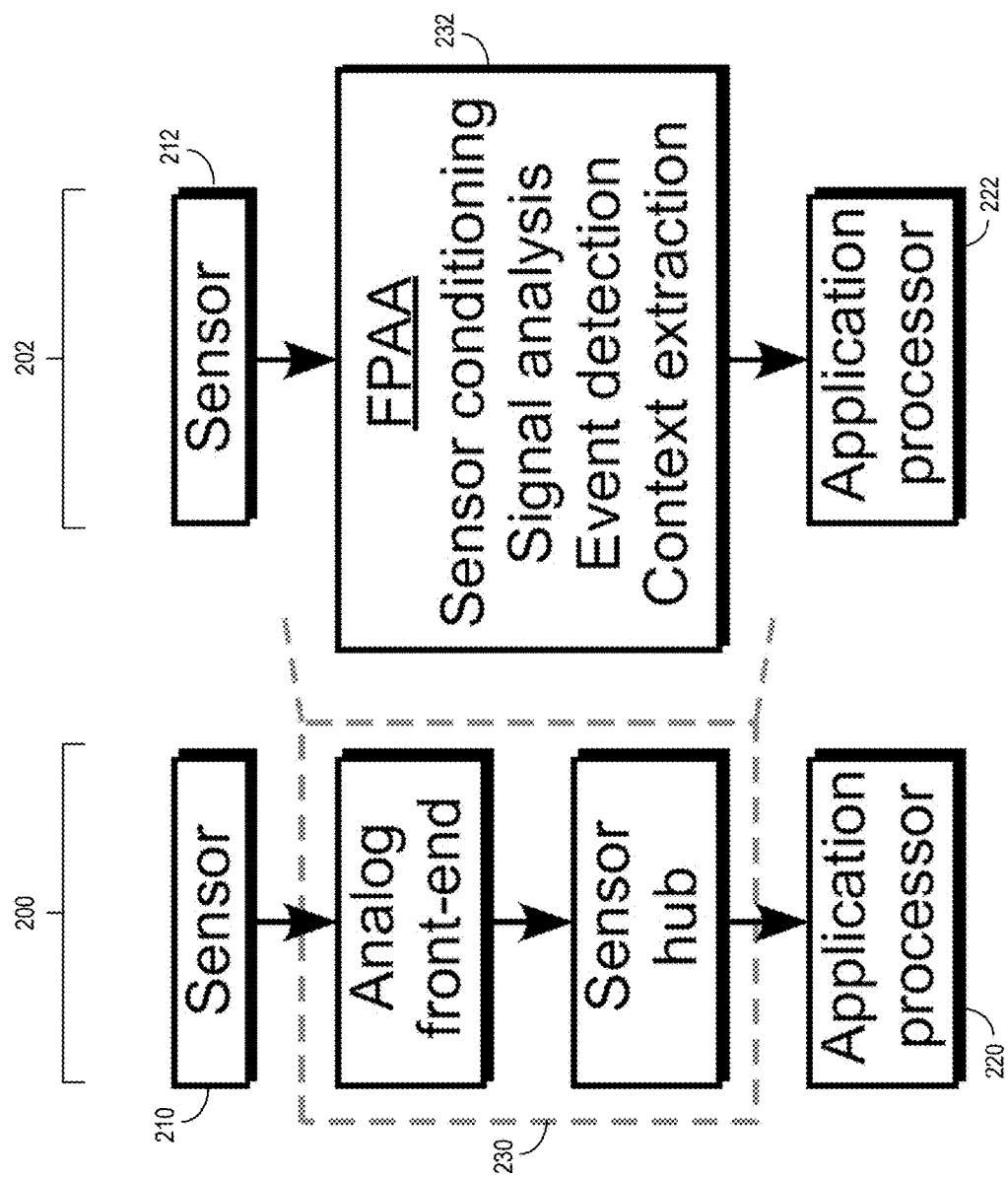
FIG. 2 illustrates a first sensing system and a second sensing system in which a programmable analog processor replaces the sensor interfacing and information extraction blocks according to some embodiments.

FIG. 2 illustrates a first sensing system 200 and a second sensing system 202. In the first sensing system 200, a sensor 210 provides information to an application processor 220 via an analog front end and sensor hub 230. In the second sensing system 202, the analog front end and sensor hub 230 are replaced with a programmable analog processor 232 (e.g., an FPAA) in accordance with some embodiments. Although some embodiments described herein are implemented using an FPAA, note that embodiments may be implemented using any other type of re-programmable analog circuitry. The "sensor hub" concept may simplify application design by using dedicated hardware to extract contextual information, generate wakeup signals, and/or handle low-level sensor tasks.

According to some embodiments, a high level user interface can be used to dynamically configure analog circuits with patterns of interest. The user interface can be implemented on a user device such as, e.g., a smart phone, tablet or computer. The high level user interface can assist in the design and configuration of the analog circuits for different applications that involve sampling and processing data from embedded sensors and where the devices being used are energy-constrained. Examples of applications include, but are not limited to: (i) remote monitoring using sensor networks (monitoring of critical infrastructure, monitoring of critical assets and national borders such as, e.g., pipeline monitoring, bridge monitoring, landslide detection and warning, etc.), (ii) monitoring of patient health using embedded medical sensors, (iii) sensing and pattern recognition applications deployed on mobile devices such as handheld smart phones, tablets, and iPads, (iv) a human voice based wakeup of energy constrained devices like smart phones, smart watches and smart eyewear.

According to some embodiments, an FPAA may be interfaced with a TelosB sensor node or "mote" (an embedded platform that integrates digital processor, sensor, and wireless communication capabilities). Some embodiments may be generalized to interface analog signal processing with other smart sensing platforms, including smart phones and tablets. Note that some embodiments may be associated with an audio based classification application where (i) the FPAA performs spectral analysis, (ii) the FPAA is interfaced with a TelosB mote platform to wake up the mote upon detection of a specific signal characteristic, and (iii) the General Purpose Input Output ("GPIO"), interrupt, Digital-to-Analog Converter ("DAC"), and Analog-to-Digital Converter ("ADC") pins of the TelosB mote may interface with the FPAA. However, a different digital sensing and processing platform could be used, a different combination of pins could be used for interfacing, a different sensing application could be implemented, a different sensor type could be used instead of audio, and/or other variations may be provided.

Steps involved in a design of the system might include, for example, fabrication of FPAAs that perform analog signal processing and/or sensor interfacing, interfacing of FPAAs with a smart sensing platform to generate an interrupt based wakeup of the digital portion of the system, design of an interface to synthesize systems on the FPAAs and set bias parameters by using 10 pins of a digital processor and/or using DACs or nonvolatile analog memory, and/or design of a high level user interface that can facilitate the synthesis of systems on the FPAAs.

It should be emphasized that the described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should also be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Figure 3:
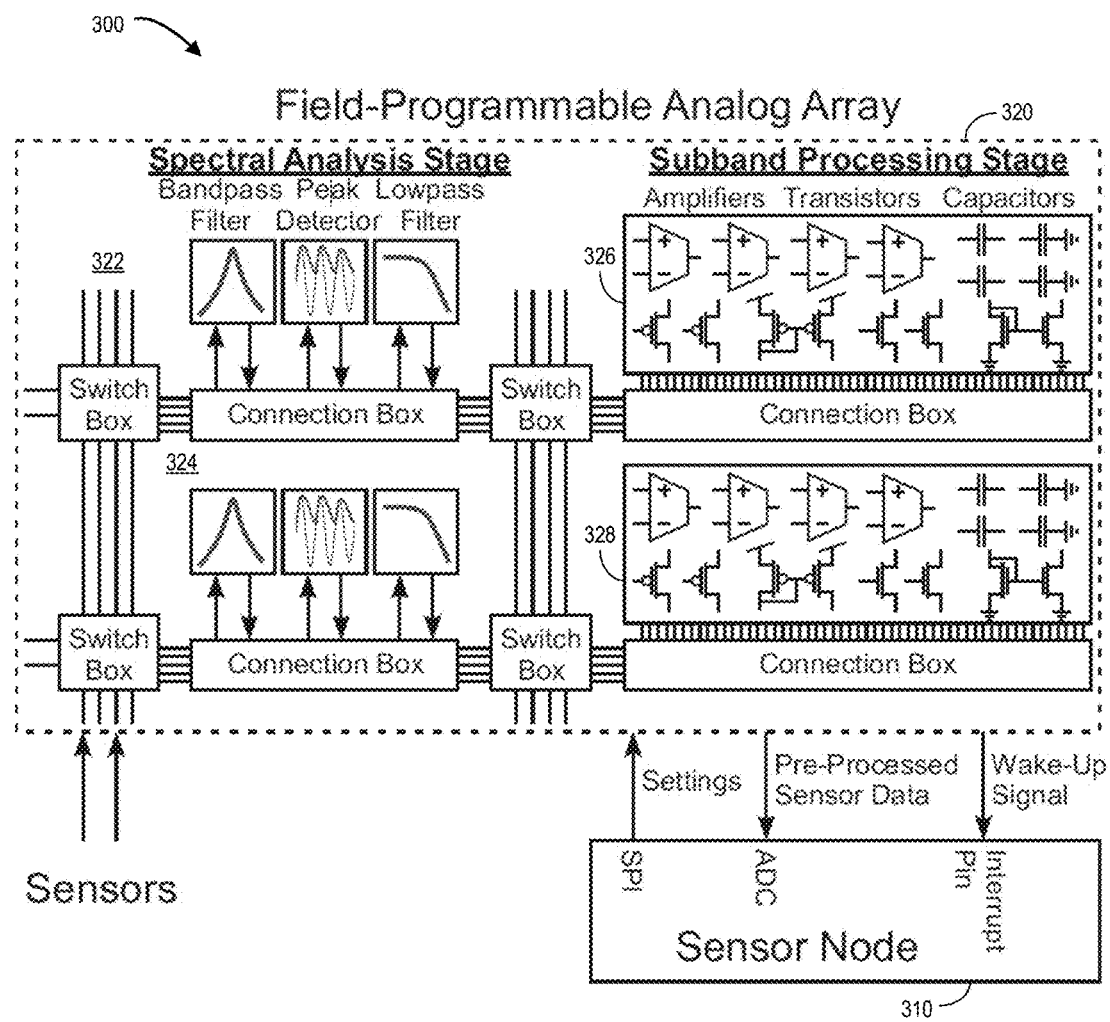
FIG. 3 is a schematic diagram illustrating an example of a sensor node including an FPAA in accordance with various embodiments.

Turning now to the figures, FIG. 3 is a schematic diagram illustrating an apparatus 300 including a sensor node 310 and an FPAA 320 in accordance with various embodiments. The sensor node 310 equipped with the FPAA 320 may, according to some embodiments, be reconfigured in runtime to perform event detection and pre-processing at a power consumption that is significantly lower than the power that would otherwise be consumed by the mote's built-in digital systems.

Note that Wireless Sensor Networks ("WSNs") are capable of a myriad of tasks, from monitoring critical infrastructure such as bridges to monitoring a person's vital signs in biomedical applications. However, the deployment of WSNs may be impractical for many applications due to their limited power budget, a substantial portion of which may be devoted to communication. In-network pre-processing may help reduce this communication overhead.

Also note that Analog Signal Processing ("ASP") is a form of in-network pre-processing that may be used to process a signal locally, provide event detection for wake-up scenarios, and more. Analog processing in sensor networks may also facilitate detection due to the analog nature of real-world signals and the substantial advantages that analog electronics have been shown to have over digital systems in terms of performance-per-power consumed.

Analog sensor interfaces in WSNs tend to be application specific and may not be capable of operating in a range of other applications. Additionally, ASP design can be a lengthy procedure as compared to digital systems design (which can make use of programmable and reconfigurable systems). Therefore, incorporation of an ASP front end may be more costly in terms of time to market and development costs.

To overcome these challenges, some embodiments described herein improve an ASP's implementation by making it reconfigurable. A reconfigurable architecture may allow a single ASP Integrated Circuit ("IC") to be used for a variety of applications and to be updated in the field as its application is redefined. Additionally, embodiments described herein may allow for more complex processing, and thus more discriminating detection of sensed phenomena.

With respect to an FPAA architecture, FPAA designs may have the ability to synthesize complex analog circuitry. Moreover, embodiments described herein provide this viability in embedded systems such as WSNs. More specifically, an FPAA's use within energy-constrained systems that monitor phenomena such as audio, vibration, and motion, which have sufficiently high bandwidths (e.g., greater than 100 Hz) to challenge the throughput of typical WSNs, may be provided.

FIG. 3 illustrates an FPAA 320 for use in WSNs consisting of four Computational Analog Blocks ("CABs"), 322, 324, 326, 328, including two for spectral analysis 322, 324 and two for subband processing 326, 328. Each spectral-analysis stage 322, 324 consists of two bandpass filters, two envelope detectors, two lowpass filters, and two buffers. These subblocks may have tunable biases, allowing a user to perform several common types of analysis on a range of signals before further processing. Further processing takes place in the subband processing CABs 326, 328, which may provide the user access to elements of a smaller granularity, including Operational Transconductance Amplifiers ("OTAs"), current mirrors, individual transistors, and/or capacitors.

A notable feature of this FPAA architecture 300 is that, because it concentrates on relatively high-frequency phenomena such as certain types of simple harmonic motion, it may provide general analog computing tasks while also being suitable for parallelized processing. The latter feature may stem from the fact that the subbands of the architecture may be configured to perform identically, and the architecture itself may be scaled up to further this task.

In this FPAA architecture 300, reconfiguration may be achieved via programmable switches in a connection box (used for intra-CAB routing) and the switch box (used for inter-CAB routing). The connection box may consist of a crossbar configuration for flexible local routing, or the connection box may consist of a customized switch configuration to maximize performance. In the switch box, a variety of connection types may be implemented (such as crossbar, crossover, and/or four-way switch points). To facilitate ease of integration with the sensor node 310, these switches may be implemented using SRAM, Flash, EPROM, or EEPROM controlled transmission gates. Each switch may have an SRAM, Flash, EPROM, or EEPROM memory cell that set it to "on" or "off." To load values, a row-by-row method may be used to load the state of all switches in a given row. The configuration may, for example, be written into the memory array using an on-chip Serial Peripheral Interface ("SPI").

Figure 4:
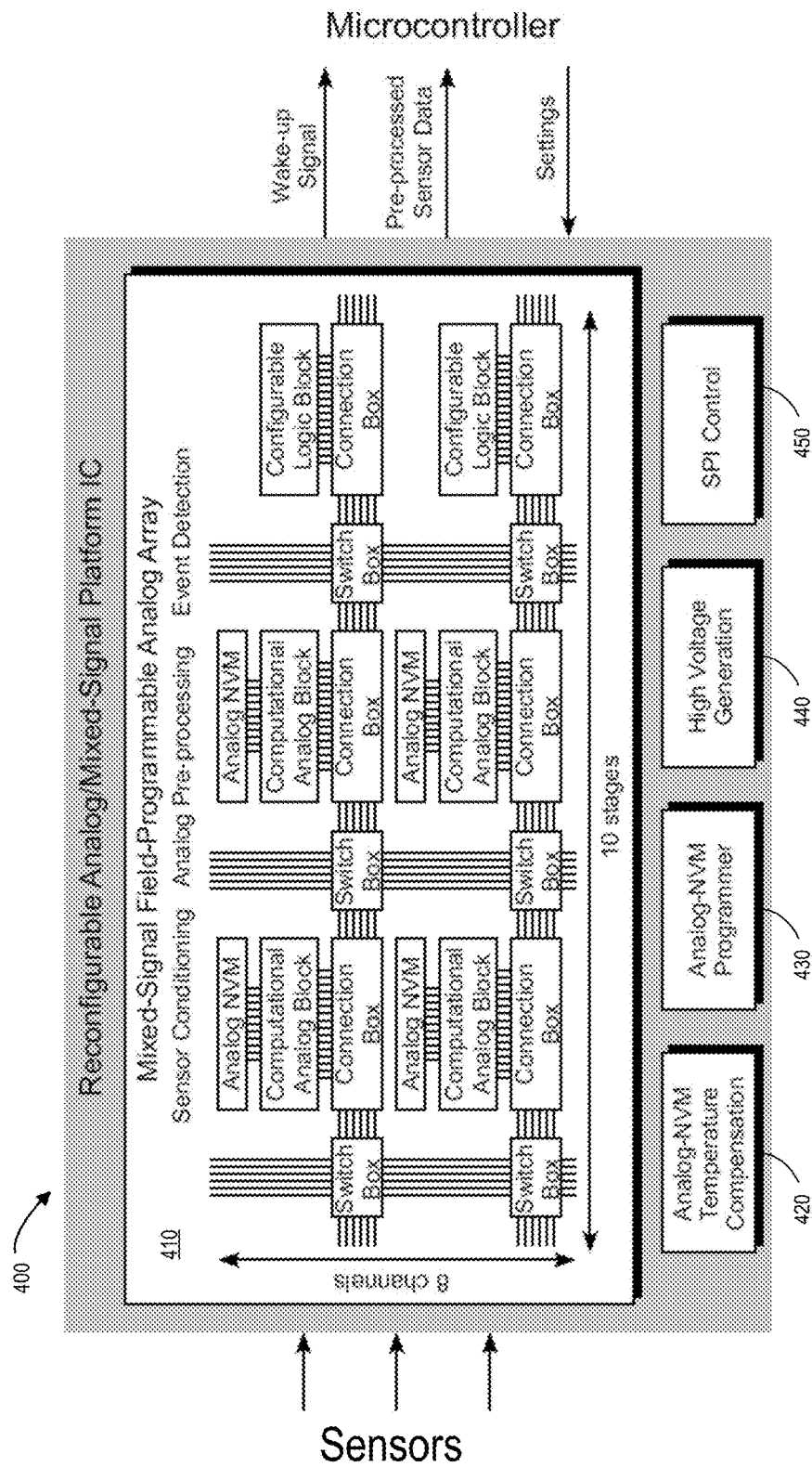
FIG. 4 is an architecture for a programmable analog processor integrated circuit.

FIG. 4 illustrates an architecture for a reconfigurable analog/mixed-signal platform IC 400 that receives signals from sensors. The reconfigurable analog/mixed-signal platform IC 400 may also receive settings from a microcontroller and provide wake-up signals and/or pre-processed sensor data to the micro controller. The reconfigurable analog/mixed-signal platform IC 400 may include a mixed-signal FPAA 410 with multiple channels and stages. The mixed-signal FPAA 410 might include, for example, switch boxes, connection boxes, computational analog blocks, configurable logic blocks, and analog Non-Volatile Memory ("NVM"). According to some embodiments, the reconfigurable analog/mixed-signal platform IC 400 also includes analog-NVM temperature compensation 420, an analog-NVM programmer 430, high voltage generation 440, and/or SPI control 450.

Figure 5:
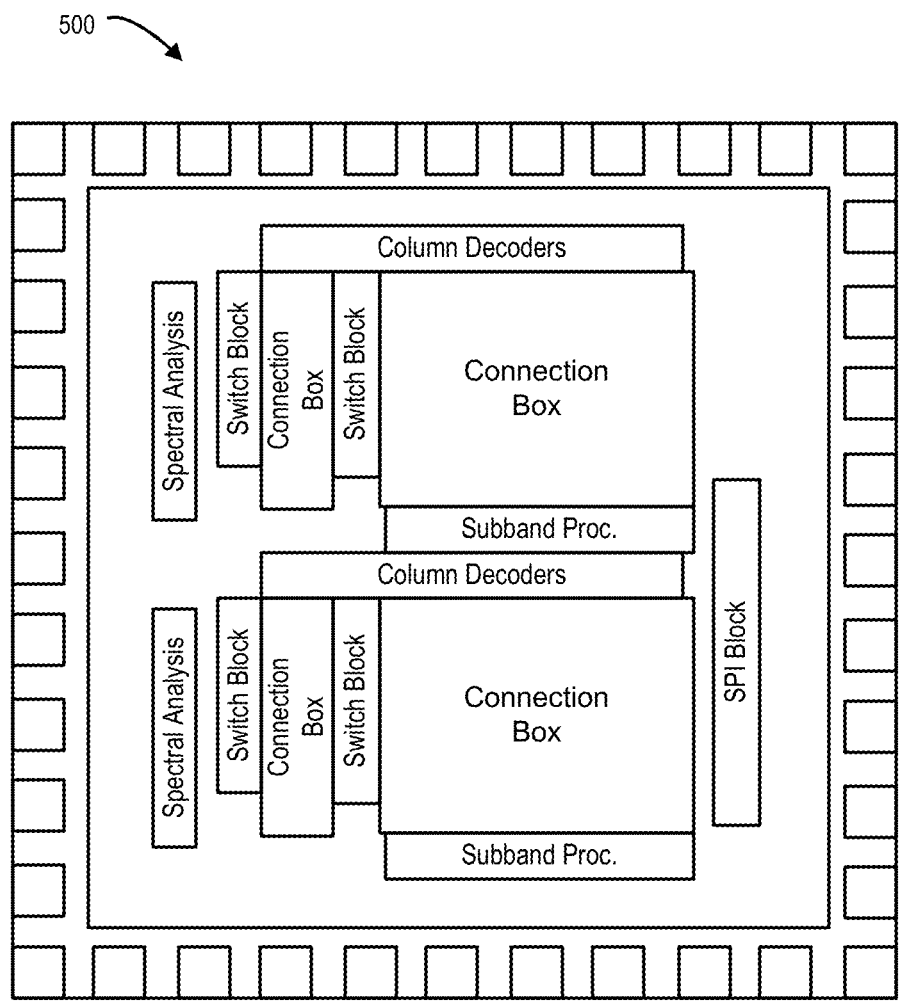
FIG. 5 is an image of an example of a fabricated FPAA of FIG. 3 in accordance with various embodiments.

FIG. 5 is an image of an example of a fabricated FPAA 500 of the FIG. 3 apparatus 300 in accordance with various embodiments. In particular, the fabricated FPAA 500 may be fabricated in a standard 0.5 μm CMOS process. The fabricated FPAA 500 may be, for example, approximately 2.25 mm$^2$ in area. By utilizing an FPAA locally at individual nodes, an application developer can easily respond to the dynamic needs of the network. The fabricated FPAA 500 may be configured to perform various processing tasks, thus reducing the information required to be transmitted. This reduction of transmitted information may be significant from a power budget standpoint, because transmission is usually characterized as one of the most power-intensive tasks of a node. Also, an FPAA may be used to characterize and detect certain events, thus creating the framework for a wake-up circuit. This wake-up circuit may be used to keep the power-intensive digital portion of the mote in a low-power sleep state until a predefined event is detected.

Note that the fabricated FPAA 500 may be programmed in, for example, approximately 100 ms through a TelosB mote. The fabricated FPAA 500 may include two stages: a spectral-analysis stage and a subband processing stage. The spectral analysis stage may be capable of filtering and/or finding the envelope of the signal. The signal may then be passed to the subband processing stage which is capable of being reprogrammed to perform a myriad of tasks. For example, 1436 switches may connect elements within the stages to as many as 40 unique nets.

With respect to mote interfacing, embodiments described herein may integrate an FPAA into a WSN sensor node in a way that enables relatively easy monitoring of a range of phenomena. For example, a Printed Circuit Board ("PCB") such as the board 600 illustrated in FIG. 6 may be provided. In particular, the board 600 includes a pair of fabricated FPAA 500 in accordance with some embodiments. The board 600 may, for example, facilitate the interfacing of FPAA to a WSN sensor node. The board 600 may incorporate a variety of sensors, a Complex Programmable Logic Device ("CPLD"), a DAC (e.g., on the underside of the board 600), and/or a socket 610 for connecting the board 300 to a TelosB mote or other MCU platforms.

Figure 6:
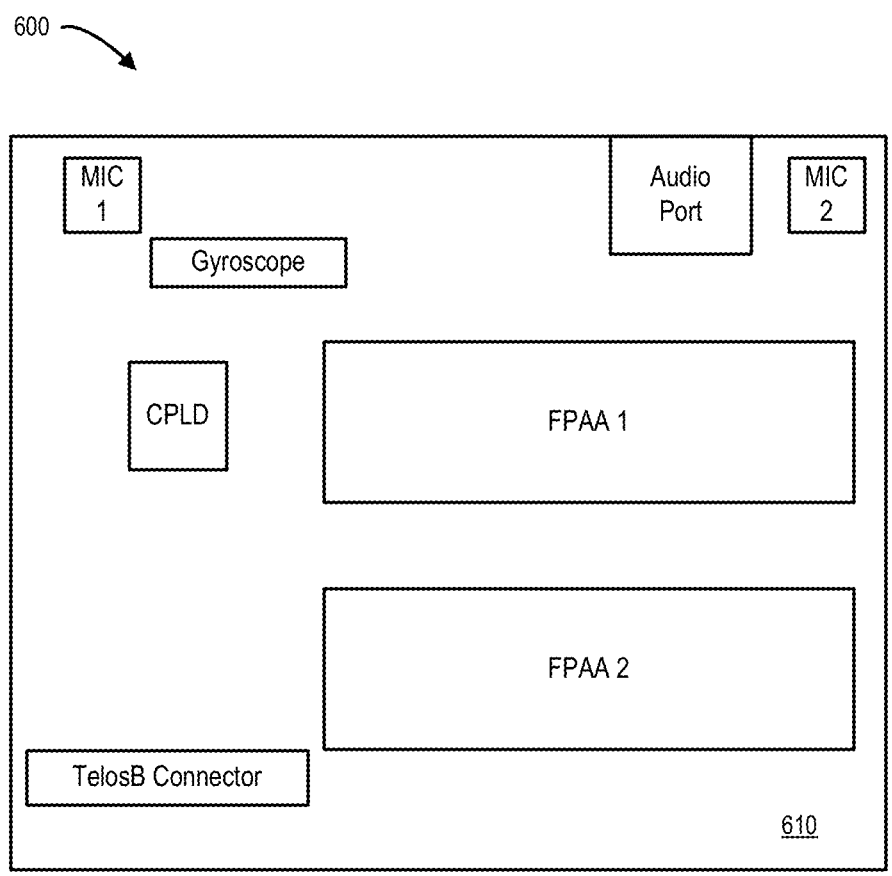
FIG. 6 is an image of an example of a printed circuit board including the FPAA of FIG. 5 in accordance with various embodiments.
Figure 7:
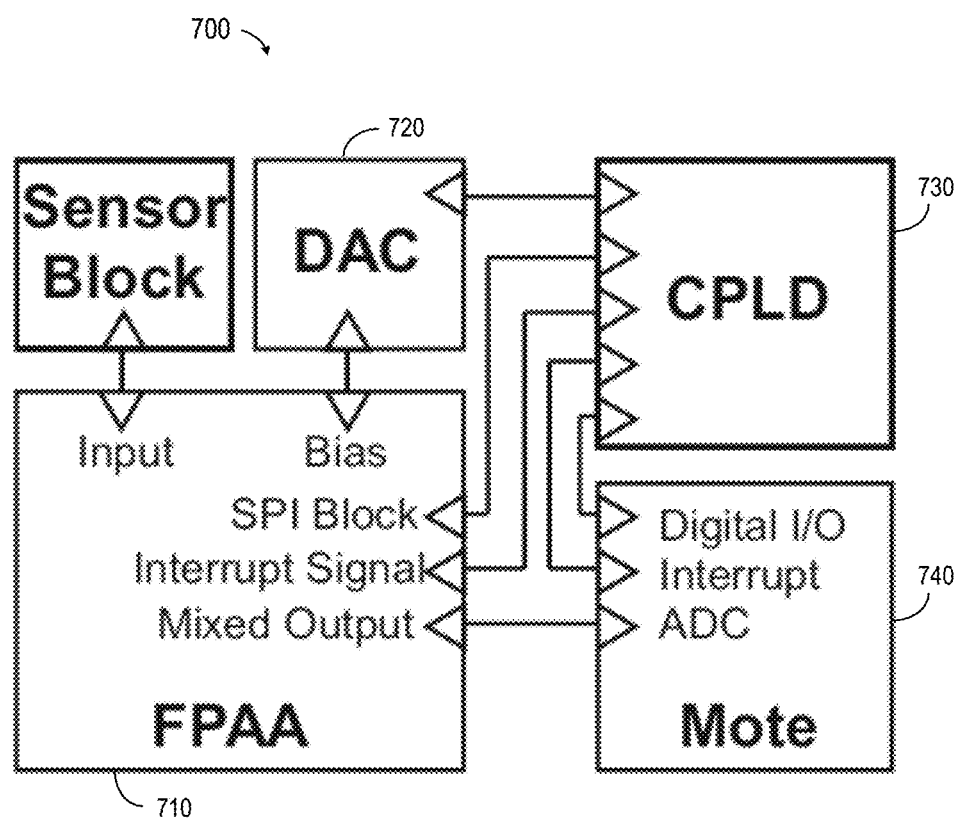
FIG. 7 is a schematic diagram illustrating an example of the PCB of FIG. 6 in accordance with various embodiments.

FIG. 7 is a schematic design 700 illustrating an example of the board 600 of FIG. 6 in accordance with some embodiments. The design 700 includes an FPAA 710 to enable scalability, a TelosB mote connector, a DAC 720 for providing bias voltages, as well as a CPLD 730. One or more sensors may be associated with relatively high-frequency phenomena that are traditionally very taxing on a WSNs power budget, including motion, audio signals, and/or various forms of simple harmonic motion. To monitor these phenomena, embodiments might include a gyroscope, two microphones (e.g., placed at opposite ends of a board to enable directional sensing), and/or a mini-stereo port to enable future expansion.

When two FPAAs 710 are included in the design 700, embodiments may effectively scale up the architecture, overcoming an IC space limitation, and/or permit even more sophisticated ASP designs. Note that FPAAs 710 may include SPI blocks that can be programmed directly through GPIO pins of an attached TelosB mote 740. The on-board CPLD 730 may be used to minimize the number of TelosB pins that are used for digital 10, thus freeing up pins to be configured as ADCs. Additionally, the CPLD 730 may be used to define even more complex wake-up events. Some embodiments may simplify the setting of individual bias points for all of the ASP blocks by including DACs 720 or on-chip nonvolatile analog memory which can be set and adjusted directly by the mote 740.

Figure 8:
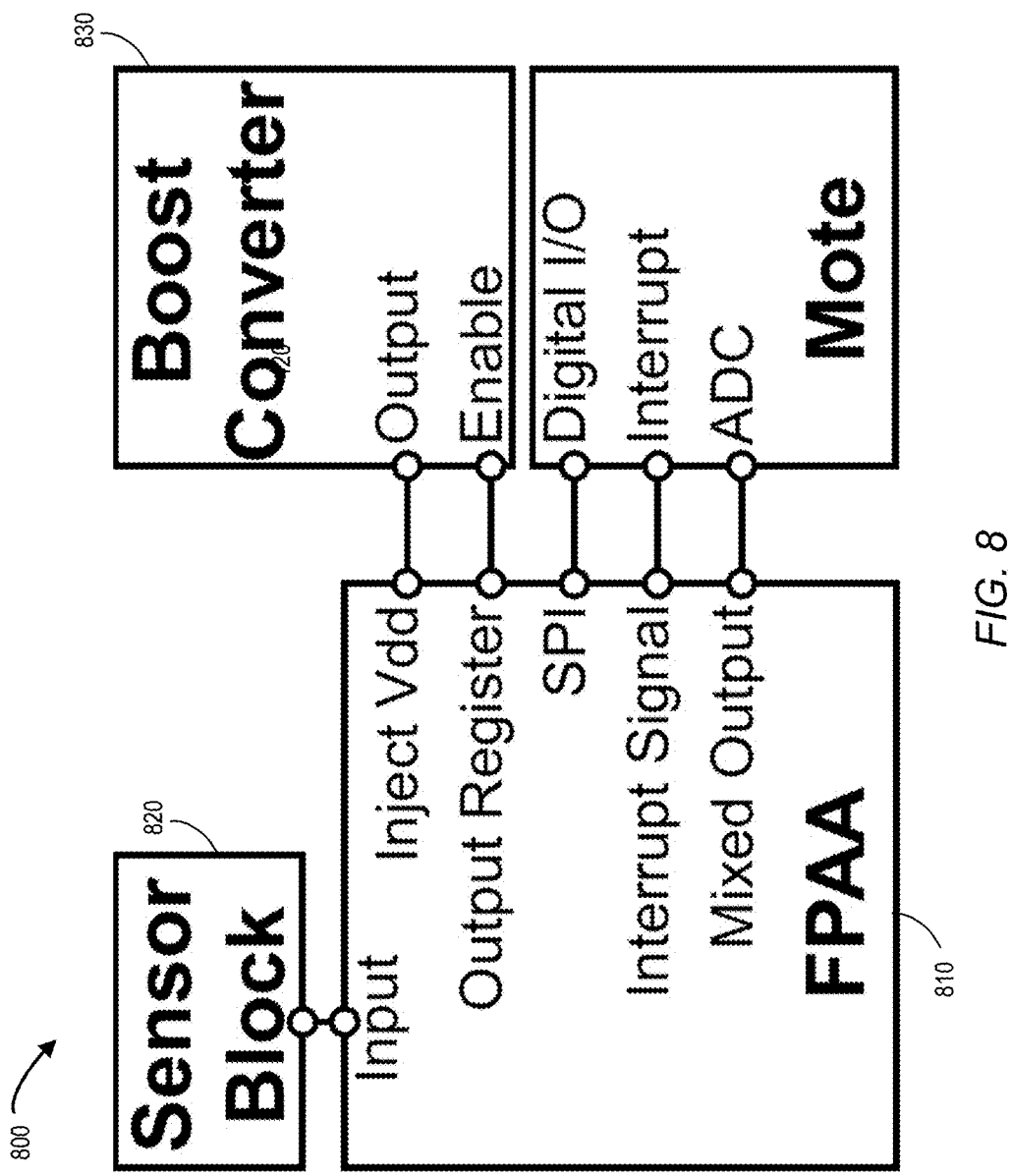
FIG. 8 is a diagram of an interface board for a programmable analog processing integrated circuit.

FIG. 8 is a diagram of an interface board 800 for a programmable analog processing IC. The board 800 includes programmable analog circuitry (e.g., FPAA 810), a variety of sensors 820 (such as a microphone, a 3-axis accelerometer, and/or a gyroscope), a boost converter 830 for programming on-chip nonvolatile analog memory, a current reference, supply voltage regulators, and a voltage reference. The board 800 may also include a header for connecting to wireless sensor nodes. This header may, for example, expose data-output pins and/or a serial interface for reprogramming the IC.

According to some embodiments, a user interface may facilitate a reconfiguration and tuning of an FPAA. The user interface may simplify the process of synthesizing analog circuits for the FPAA to aid WSN designers who may not have the circuit-level expertise usually required to construct an ASP. According to some embodiments, the user interface may allow users to construct individual ASP blocks and see the routing that the device will use to connect them. Once the user is satisfied with the design, the configuration, which may consist of switch settings and circuit bias values, may be converted to a header file by a computer program. The updated header file may then be uploaded to the base-station mote, which may run TinyOS, and then wirelessly transmitted to remote nodes. A remote node may then apply the new configuration to its FPAA.

With respect to compression, the size of an FPAA may represent an important design choice when designing the apparatus for use in a WSN. While it may be desirable to have an FPAA that is large enough to create sophisticated ASP designs, care may be taken to minimize the overhead of delivering and storing large configuration files within the network. A naive approach for handling configuration files is to simply transmit the raw bits that will eventually be shifted into the FPAA. For example, the configuration file for the switch configuration 900 illustrated in FIG. 9A will consist of 64 bits (4 rows of 16 columns), only three of which are "on," implying that the configuration is redundant. If this method was scaled to a larger FPAA, then significant energy may be wasted when transmitting and receiving these redundant bits.

To address this, a compression method may be incorporated. The compression method may, for example, be inspired by entropy coding but also be informed about typical FPAA configurations. Note that configuration files may tend to be relatively small. As a result, traditional methods that utilize a codebook (e.g., Huffman coding) may have too much overhead. Even when considering FPAAs of larger scale, ASP algorithms may tend to have a parallel nature and are still amenable to compression. For example, a large filter bank might utilize the same operation in each subband. This identical operation means that the switch settings would be the same in all channels. As a result, it may only be necessary to transmit the settings for one channel and then apply those settings to the remaining channels.

Figure 9A:
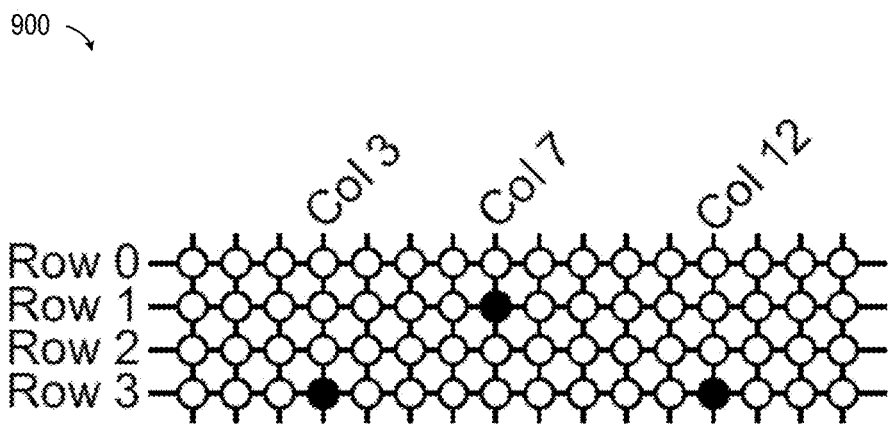
FIGS. 9A and 9B illustrate examples of a configuration of switches and a format for transmission of the format information in accordance with various embodiments.
Figure 9B:
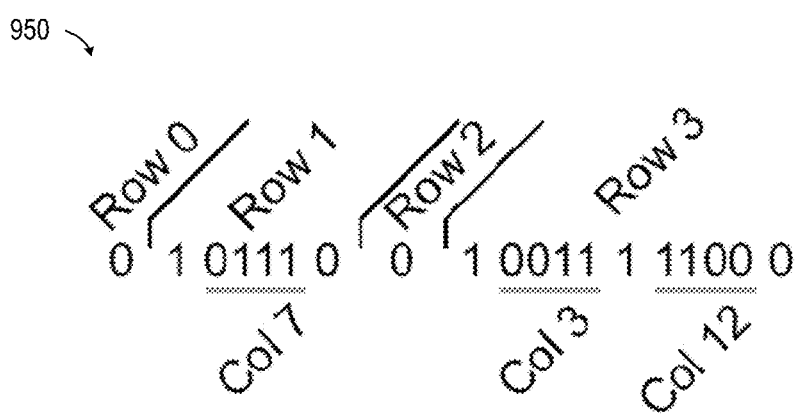

Due to redundancies in the switching matrix, many rows may tend to have no switch set. Therefore, a row-by-row configuration scheme might begin by delineating whether or not any switch within a given row is set within. Only if a switch is set within the row, is the location of the switch within that row specified using a four bit identification number. FIG. 9B illustrates an example 950 of a format for transmission of the switch information for the switch configuration 900 in FIG. 9A in accordance with some embodiments. In this example, the 64 bit configuration of FIG. 9A is reduced to 19 bits. The size of the compressed configuration may depend upon the number of "on" switches Non, and may be equal to 5Non+Nrows, where Nrows is the number of rows in the FPAA. The energy for the mote to decode the configuration may be, for example, 34.1 µJ and the reduction in transmitted data may save 3.5 mJ.

To illustrate the functionality of FPAA-based ASP designs in WSNs, consider an FPAA interface board, coupled to a TelosB mote, that includes several signal-processing circuits. Each of these circuits may be used to generate wakeup signals to turn on the TelosB mote. In each scenario described herein, reconfiguration commands may be sent over a radio through another TelosB mote, which may act as the base station.

Figure 10:
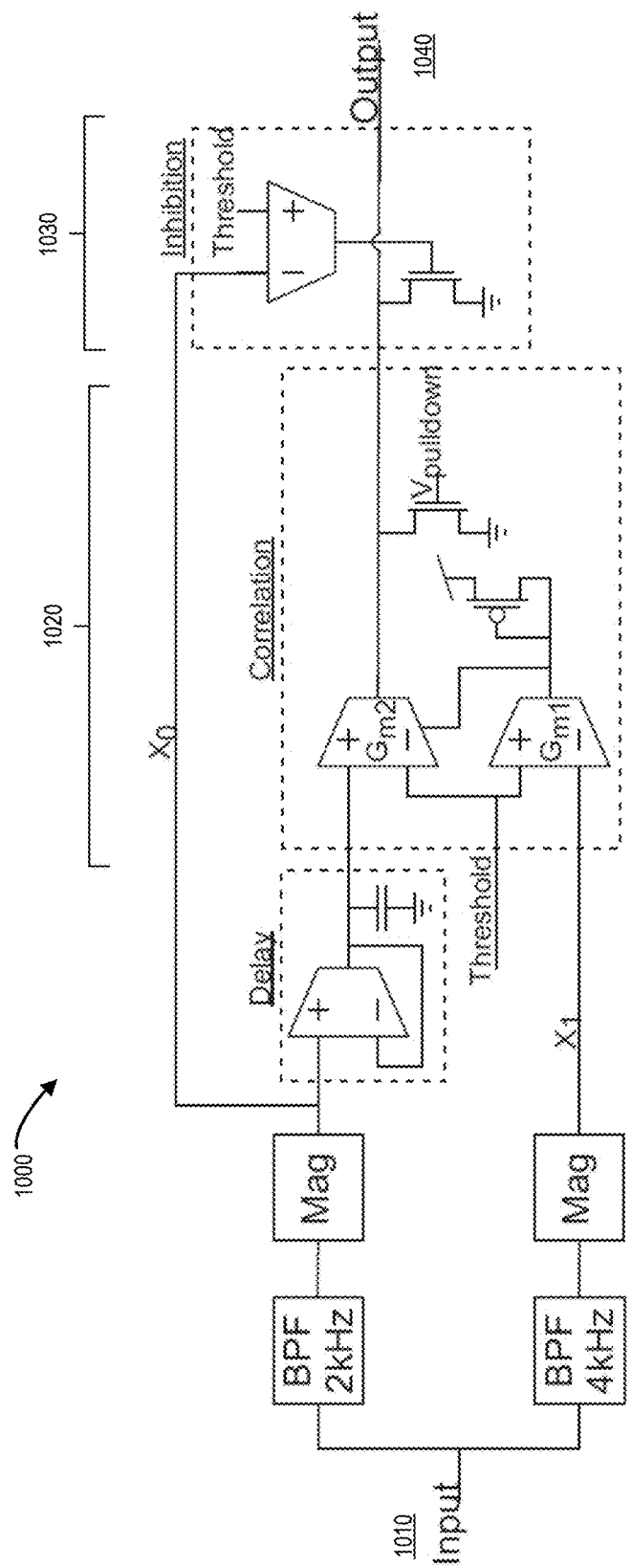
FIG. 10 is a schematic diagram illustrating an example of a circuit for spectral analysis implemented in the FPAA of FIG. 3 in accordance with various embodiments.
Figure 11:
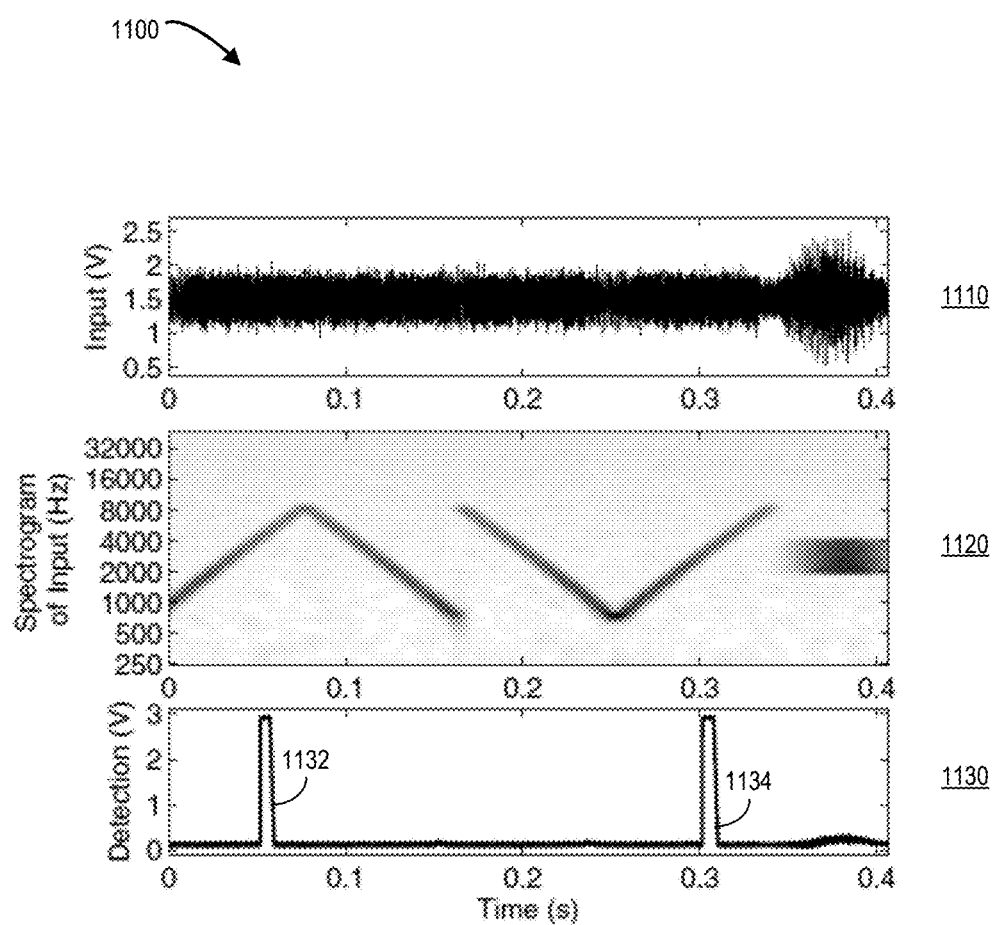
FIG. 11 includes plots illustrating an example of spectral analysis by the circuit of FIG. 10 in accordance with various embodiments.

A first example to demonstrate the ability of an FPAA to perform basic spectral analysis is illustrated in FIGS. 10 and 11. In particular, FIG. 10 is a schematic diagram illustrating an example of a circuit 1000 for spectral analysis implemented in the apparatus 300 of FIG. 3 in accordance with some embodiments. The circuit 1000 detects portions of an input signal 1010 where the frequency content rises in the 2-4 kHz range. A "Correlation" stage 1020 detects the simultaneous presence of content in the high frequency band and the delayed low-frequency band. An "Inhibition" stage 1030 nulls the output when content is present in the low-frequency band to avoid triggering on wideband signals. Gm2 is biased by the gate of an attached pFET while the output current of Gm1 is mirrored through a diode connected FET. Also note that Vpulldown is a constant bias used to weakly pull down the output when Gm2 is shutoff by Gm1.

FIG. 11 includes plots 1100 illustrating an example of spectral analysis by the circuit 1000 of FIG. 10 in accordance with some embodiments. In particular, the plots include a spectral analysis performed by the analog IC 1110, 1120 (the transient plot 1110 and the spectrogram plot 1120 of the input signal 1010, respectively). The sinusoidal signal, which includes Gaussian noise, varies from 1 kHz to 8 kHz and concludes with a steady input of ten sine waves ranging from 2 kHz to 4 kHz. The output 1040 of the circuit 1000 (detection 1130) successfully detects two portions 1132, 1134 of the input signal 1010 where the frequency content is rising in the 2-4 kHz range.

That is, the FPAA circuit 1000 was configured to analyze a signal's frequency content and detect a rising frequency in the 2-4 kHz range. The input signal is first filtered through parallel bandpass filters set to center frequencies of 2 kHz and 4 kHz. The lower frequency signal (x0) is then delayed. A cascade of OTAs computes the product of the delayed low-frequency signal with the instantaneous high-frequency signal (x1), thus providing a measure of simultaneity, reminiscent of a motion-analysis system. To ensure that static wideband signals do not trigger the detector, the final portion of the circuit 1000 pulls the output low when x0 is high. The resulting output is high only when the x1 and the delayed version of x0 are both high and the x0 is not high. As a result, the pulses 1132, 1134 are generated when the signal is rising in the correct frequency range.

Figure 12:
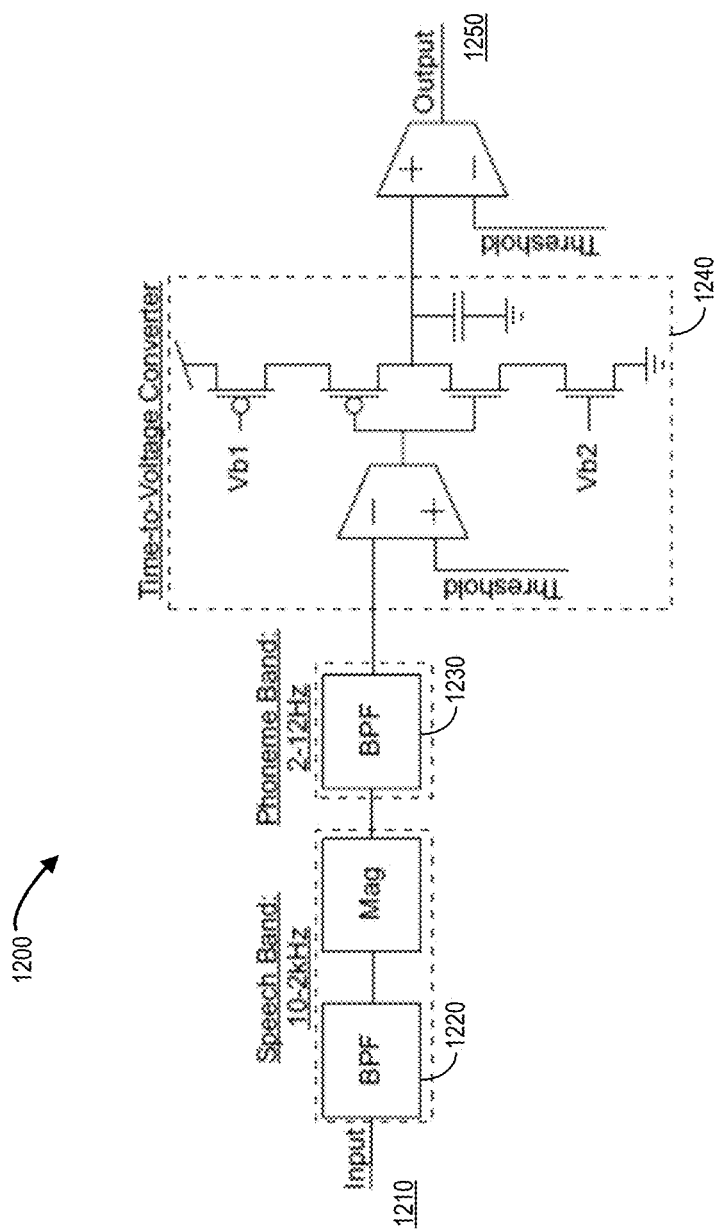
FIG. 12 is a schematic diagram illustrating an example of voice activity detection implemented in the FPAA of FIG. 3 in accordance with various embodiments.
Figure 13:
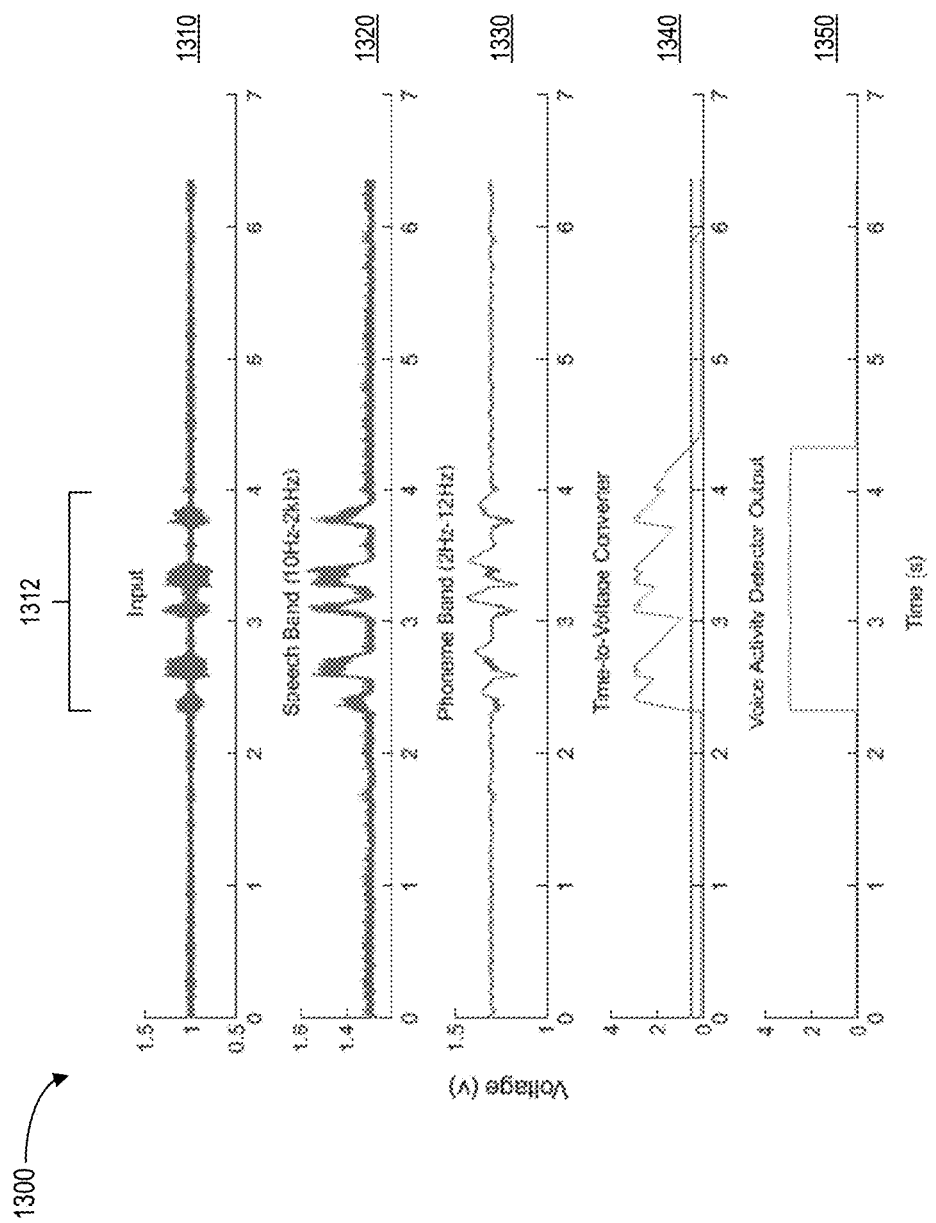
FIG. 13 includes plots illustrating an example of signals at each stage of the voice activity detection of FIG. 12 in accordance with various embodiments.

A second example to demonstrate the ability of an FPAA to implement a voice-activity detector is illustrated in FIGS. 12 and 13. In particular, FIG. 12 is a schematic diagram illustrating a circuit 1200 for voice activity detection implemented in the apparatus 300 of FIG. 3 in accordance with some embodiments. The circuit 1200 triggers an event when the amplitude modulation in the speech band occurs in an input signal 1210 at a rate that is typical of speech. The input signal 1210 is first passed through a spectral analysis CAB where it is filtered from 10 Hz to 2 kHz using a bandpass filter 1220. The envelope of this speech band is then found and passed through another bandpass filter 1230, with corner frequencies at 2 Hz and 12 Hz corresponding to the phoneme band. The magnitude of the phoneme band is then used to trigger a time-to-voltage converter 1240 that creates a ramping voltage when the phoneme band exceeded a specified threshold. The time-to-voltage converter 1240 then triggers an output event 1250 when this ramped voltage exceeded a threshold.

FIG. 13 includes plots 1300 illustrating an example of signals 1310, 1320, 1330, 1340, 1350 at each stage of the voice activity detection circuit 1200. Note that the speech portion 1312 of the input signal 1210 is correctly identified in the presence of noise. The input signal 1210 may comprise, for example, a male voice corrupted by noise from an airport environment at a signal-to-noise ratio of 10 dB. The overall output 1350 can be used to identify to the rest of a sensor node that a signal of interest has been detected.

Figure 14:
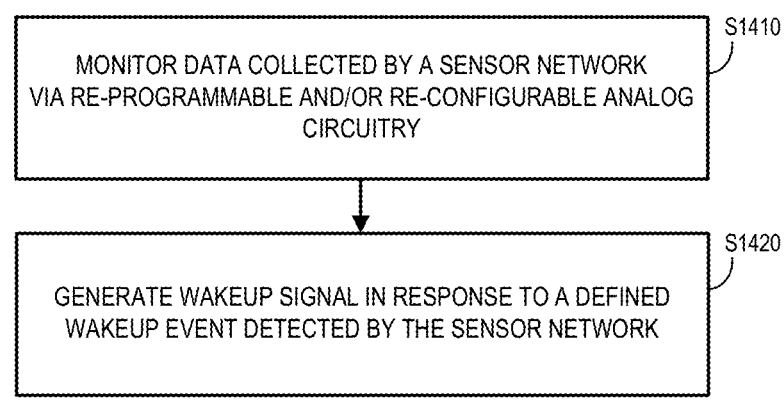
FIG. 14 illustrates a method in accordance with some embodiments.

The circuits and other elements may operate in accordance with any of the embodiments described herein. For example, FIG. 14 is a flow diagram of a process 1400 according to some embodiments. Note that all processes described herein may be executed by any combination of hardware and/or software. The processes may be embodied in program code stored on a tangible medium and executable by a computer to provide the functions described herein. Further note that the flow charts described herein do not imply a fixed order to the steps, and embodiments of the present invention may be practiced in any order that is practicable.

At S1410, data collected by a sensor network is monitored via re-programmable (e.g., the function of the device may be modified by varying a parametric quality of the circuitry) and/or reconfigurable (e.g., the function of the device may be modified by setting/resetting connections to change the topology of the circuitry) analog circuitry. As used herein, the phrase "sensor network" may refer to, for example, a network having only one sensor (e.g., a single embedded sensor node) or to a network having a plurality of sensors (e.g., an interconnection of embedded sensor nodes). The re-programmable analog circuit may comprise, for example, a reconfigurable FPAA comprising a plurality of computational analog blocks configured to process signals from the sensor network. At least one of the computational analog blocks may comprise a spectral analysis stage. Moreover, at least two of the computational analog blocks may be configured to perform parallel processing of signals from the sensor network.

As used herein, the term "FPAA" may refer to, for example, any device that contains re-programmable and/or re-configurable analog circuitry. The device may also be augmented with re-programmable and/or re-configurable digital circuitry. The circuitry may be typically arranged in a re-configurable matrix of re-programmable circuit blocks. Note, however, that other architectures may also be within the spirit of this invention, such as architectures that are re-programmable but not re-configurable, architectures that are re-configurable but not re-programmable, architectures in which the circuit blocks are re-configurable (and thus are not placed in a re-configurable matrix), and/or architectures in which the re-configurable matrix itself is re-programmable. Furthermore, the matrix of circuit blocks may be scaled to any size and may consist of identical or varying types of circuit blocks. The function of the device may be modified to provide various sensor interfacing, signal conditioning, signal processing, event detection, and/or wake-up generation capabilities.

At S1420, a wakeup signal is generated in response to a defined wakeup event detected by the sensor network. The wakeup signal may, for example, wake up digital processing circuitry from a hibernation state via the wakeup signal. The defined wakeup event may be associated with, for example, a variation in frequency over a defined range of frequencies and/or a presence of speech within a predefined frequency band.

Figure 15:
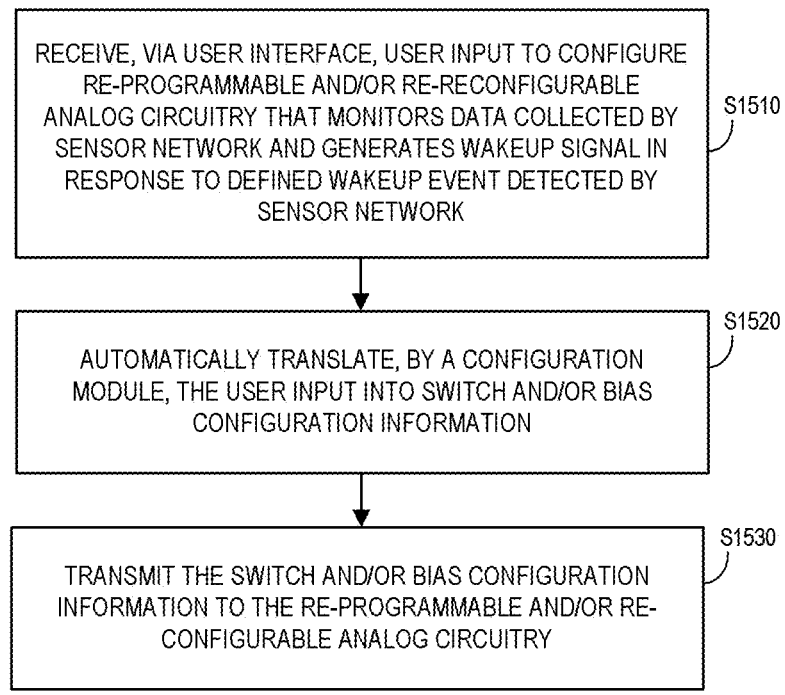
FIG. 15 illustrates a method associated with a user interface in accordance with some embodiments.

FIG. 15 illustrates a method associated with a user interface in accordance with some embodiments. At S1510, user input may be received via a user interface to configure re-programmable and/or reconfigurable analog circuitry that monitors data collected by a sensor network and generates a wakeup signal in response to a defined wakeup event detected by the sensor network. At S1520, a configuration module may automatically translate the user input into switch configuration information.

At S1530, the switch and/or bias configuration information may be transmitted to the re-programmable and/or re-configurable analog circuitry (e.g., via a wireless signal). According to some embodiments, prior to this transmitting, the switch and/or bias configuration information may be compressed, and the transmitted switch and/or bias configuration information is the compressed switch and/or bias configuration information.

Thus, some embodiments described herein may be associated with the limited power budgets of sensor networks (including, for example, power budgets that are limited due to battery constraints) that necessitate some level of in-network pre-processing to reduce communication overhead. The low power consumption of ASP may be well-suited for this task. Note, however, that the adoption of this technology may be restrained by the fact that ASP implementation requires a priori knowledge of the application space. Some embodiments described herein may enable run-time reconfiguration through the use of an FPAA. In the same way that reconfigurable digital systems allow system designers to change the infrastructure of digital blocks, an FPAA may allow an application developer to change the infrastructure of, and even tune, ASP blocks without circuit-level expertise. According to some embodiments, an FPAA can be used to (1) facilitate the use of ASP to reduce power consumption, and to (2) allow for run-time reconfiguration to facilitate ASP impact.

Embodiments have been described herein solely for the purpose of illustration. Persons skilled in the art will recognize from this description that embodiments are not limited to those described, but may be practiced with modifications and alterations limited only by the spirit and scope of the appended claims.

What is claimed is:

1. A system, comprising:
   a sensor network; and
   re-programmable and/or reconfigurable analog circuitry configured to monitor data collected by the sensor network, transform the collected data via one or more layers of processing into a space where defined wakeup events are separated from noise and other events, and selectively generate a wakeup signal in response to a defined wakeup event detected by the sensor network indicating that the collected data is associated with amplitude modulation in a speech band, wherein the defined wakeup event is programmable, after the system is deployed, by receipt of a wireless signal associated with switch and/or bias information.

2. The system of claim 1, further comprising digital processing circuitry configured to wake up from a hibernation state in response to the wakeup signal.

3. The system of claim 1, wherein the defined wakeup event is further associated with a frequency movement in pre-defined direction within a defined range of frequencies.

4. The system of claim 1, wherein the sensor network is configured to detect at least one of audio, vibration and motion.

5. The system of claim 1, wherein the sensor network comprises a microphone.

6. The system of claim 1, wherein the re-programmable analog circuit comprises a reconfigurable Field-Programmable Analog Array ("FPAA") including a plurality of computational analog blocks configured to process a signal received from the sensor network.

7. The system of claim 6, wherein at least one of the plurality of computational analog blocks comprises a spectral analysis stage.

8. The system of claim 6, wherein at least two of the plurality of computational analog blocks are configured to perform parallel processing of signals from the sensor network.

9. The system of claim 1, further comprising a wireless interface for communication with a user device.

10. The system of claim 9, wherein the re-programmable analog circuitry is configured via a user interface implemented on the user device.

11. The system of claim 10, wherein the re-programmable analog circuitry comprises a Field-Programmable Analog Array ("FPAA).

12. A method, comprising:
   monitoring data collected by a sensor network via re-programmable and/or reconfigurable analog circuitry;
   transforming the collected data via one or more layers of processing into a space where defined wakeup events are separated from noise and other events; and
   generating a wakeup signal in response to a presence of speech condition detected by a multi-stage analysis of the data collected by the sensor network, wherein the presence of speech condition is programmable after the sensor network and re-programmable and/or reconfigurable analog circuitry are deployed.

13. The method of claim 12, further comprising:
   waking up digital processing circuitry from a hibernation state via the wakeup signal.

14. The method of claim 12, wherein the re-programmable and/or reconfigurable analog circuit is a reconfigurable Field-Programmable Analog Array ("FPAA") comprising:
   a plurality of computational analog blocks configured to process signals from the sensor network, wherein at least one of the computational analog blocks comprises a spectral analysis stage and at least two of the computational analog blocks are configured to perform parallel processing of signals from the sensor network.

15. A system, comprising:
   a sensor network; and
   re-programmable and/or reconfigurable analog circuitry configured to monitor data collected by the sensor network, transform the collected data via one or more layers of processing into a space where defined wakeup events are separated from noise and other events, and selectively generate a wakeup signal in response to a defined wakeup event detected by the sensor network indicating that the collected data is associated with a rise in frequency content within a pre-determined band, wherein the defined wakeup event is programmable, after the system is deployed, by receipt of a wireless signal associated with switch and/or bias information.

16. The system of claim 15, further comprising digital processing circuitry configured to wake up from a hibernation state in response to the wakeup signal.

17. The system of claim 15, wherein the defined wakeup event is further associated with a presence of speech within a predefined frequency band.

18. The system of claim 15, wherein the sensor network is configured to detect at least one of audio, vibration and motion.

19. The system of claim 15, wherein the sensor network comprises a microphone.

20. The system of claim 15, wherein the sensor network comprises a gyroscope.

* * * * *